United States Patent [19]
Kawashima et al.

[11] Patent Number: 5,535,003
[45] Date of Patent: *Jul. 9, 1996

[54] WAVELENGTH STABILIZING LIGHT SOURCE APPARATUS BY MAINTAINING A CONSTANT PHASE DIFFERENCE

[75] Inventors: Hiroyuki Kawashima; Fumio Ohtomo; Susumu Saito; Isao Minegishi, all of Tokyo, Japan

[73] Assignee: Kabushiki Kaisha TOPCON, Japan

[*] Notice: The term of this patent shall not extend beyond the expiration date of Pat. No. 5,453,833.

[21] Appl. No.: 413,909

[22] Filed: Mar. 30, 1995

Related U.S. Application Data

[63] Continuation of Ser. No. 61,558, May 17, 1993, Pat. No. 5,453,833.

[30] Foreign Application Priority Data

May 20, 1992 [JP] Japan .................... 4-151133

[51] Int. Cl.⁶ ............................................ G01B 9/02
[52] U.S. Cl. .................................. 356/345; 356/358
[58] Field of Search .................... 356/345, 354, 356/355, 358, 349, 361

[56] References Cited

PUBLICATIONS

D. A. Jackson, "Monomode Optical Fibre Interferometer for Precision Measurement", Dec. 1985, pp. 985–987.

*Primary Examiner*—Samuel A. Turner
*Assistant Examiner*—Robert Kim
*Attorney, Agent, or Firm*—Ronald P. Kananen

[57] ABSTRACT

A wavelength stabilizing light source apparatus comprising a light source, a beam splitter, a scanning mirror, a reflector, a first and a second light receiver, a phase detector and a wavelength stabilizer. The first light receiver receives a first interference signal formed from the interference between coherent light coming from the scanning mirror and coherent light reflected by the first reflecting surface. The second light receiver receives a second interference signal formed from the interference between the coherent light coming from the scanning mirror and the coherent light reflected by the second reflecting surface. The phase detector detects the difference in phase between the first and the second interference signal. The wavelength stabilizer stabilizes the wavelength of the light source by keeping constant the phase difference detected by the phase detector. The apparatus also includes an optical path length difference forming device for keeping a constant difference in length between the first optical path of its first member and the second optical path of its second member despite changes in temperature.

3 Claims, 12 Drawing Sheets

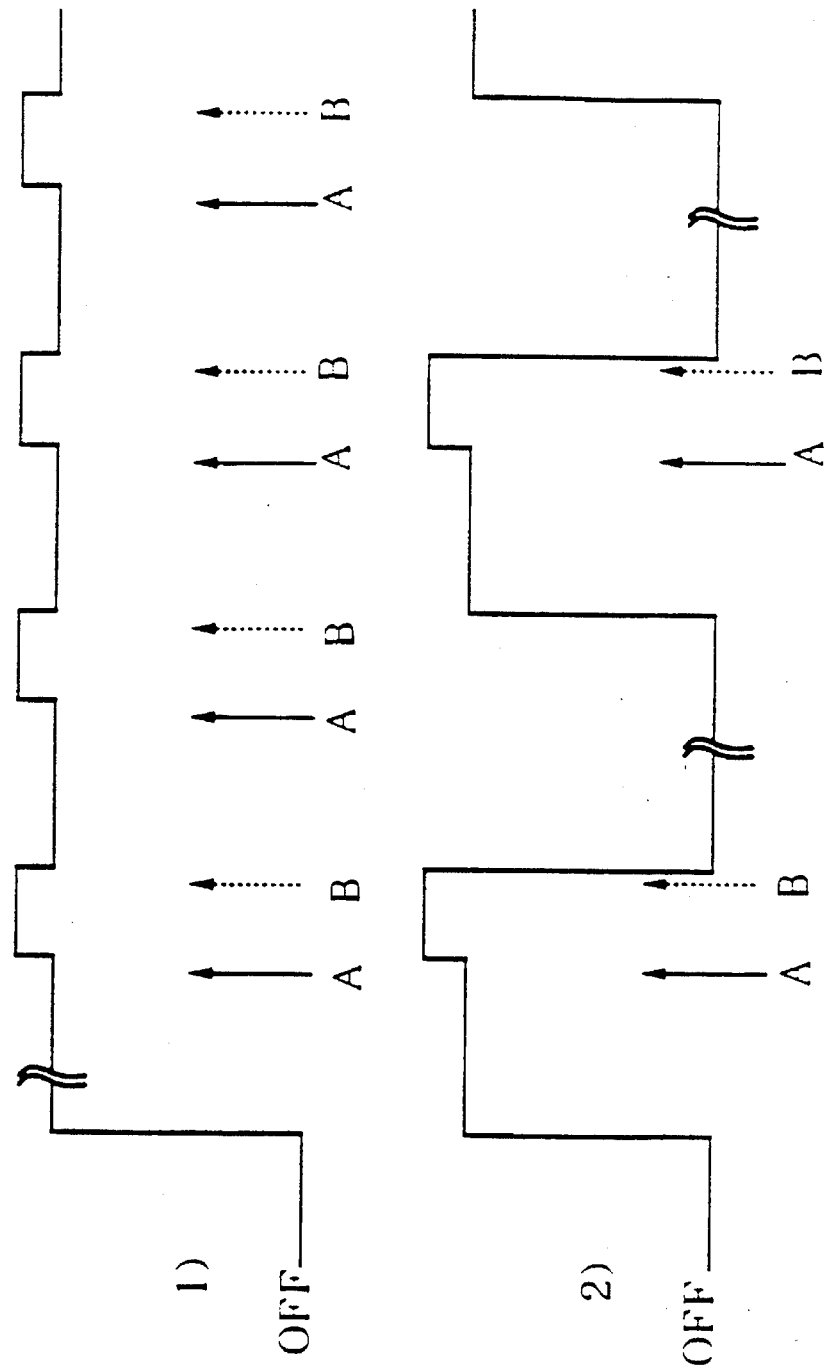

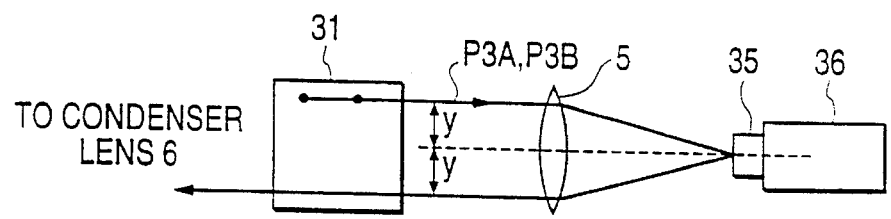
FIG. 11a
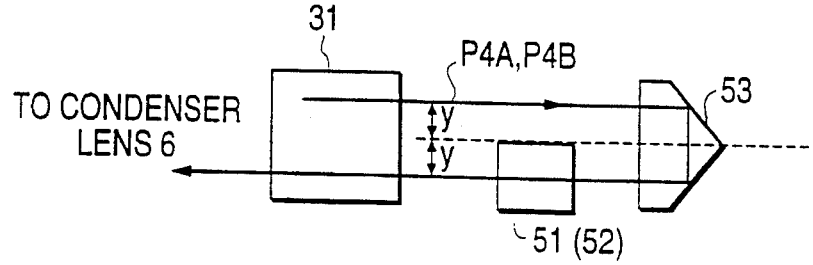
FIG. 11b
FIG. 12
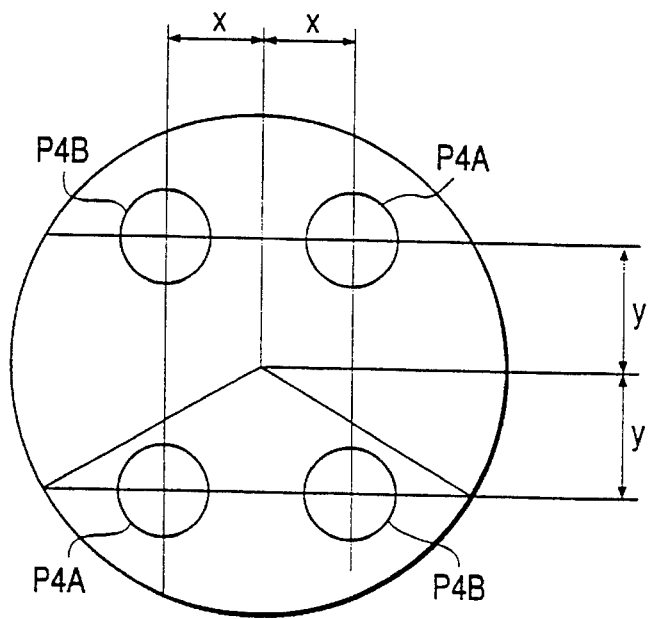

WAVELENGTH STABILIZING LIGHT SOURCE APPARATUS BY MAINTAINING A CONSTANT PHASE DIFFERENCE

This application is a continuation of application Ser. No. 08/061,558 filed May 17, 1993 now a U.S. Pat. No. 5,453,833.

BACKGROUND OF THE INVENTION

The present invention relates to a wavelength stabilizing light source apparatus for stabilizing the oscillation wavelength of the light emitted by a light source such as a semiconductor laser, the apparatus being additionally equipped with an optical path length difference forming device.

Of various light sources, semiconductor laser devices have received widespread acceptance as a coherent light source in many fields. Because the oscillation wavelength of a semiconductor laser is highly susceptible to the fluctuations in temperature and inrush current, such fluctuations need to be minimized wherever the semiconductor laser device is used.

One conventional way to minimize the fluctuations in temperature and injection current is to equip the semiconductor laser device with an electronic heating and cooling device such as a Peltier device as well as with a temperature detector such as a thermistor to measure the temperature of the semiconductor laser device. In operation, the Peltier device is driven by the signal output from the thermistor so as to keep constant the temperature of the semiconductor laser device. Under a more precise stabilizing method of the prior art called an external feedback method, there is provided an etalon plate setup and/or an atomic and molecular absorption line arrangement stipulating a wavelength reference. Differences with respect to the wavelength reference are represented by error signals that are fed back to the semiconductor laser device where the temperature and inrush current are corrected accordingly to stabilize the oscillation wavelength.

One disadvantage of the above wavelength reference-based stabilizing device is that it tends to be large in scale and thus expensive. With this kind of device, the precision of wavelength stabilization depends on the bandwidth of the detection characteristic in effect when error signals are detected as well as on the accuracy of peak value detection.

SUMMARY OF THE INVENTION

It is therefore an object of the present invention to provide a wavelength stabilizing light source apparatus that overcomes the above and other deficiencies and disadvantages of the prior art.

In carrying out the invention and according to one aspect thereof, there is provided a wavelength stabilizing light source apparatus comprising: a light source for emitting a coherent light beam; a beam splitter for splitting the coherent light beam from the light source into two optical paths; a scanning mirror located on one of the two optical paths stemming from the beam splitter and made movable in the direction of optical axis; a reflector located on the other optical path stemming from the beam splitter and having a first and a second reflecting surface, the first reflecting surface reflecting light over a first optical path length, the second reflecting surface reflecting light over a second optical path length; a first light receiver for receiving a first interference signal formed from the interference between the coherent light coming from the scanning mirror and the coherent light reflected by the first reflecting surface; a second light receiver for receiving a second interference signal formed from the interference between the coherent light coming from the scanning mirror and the coherent light reflected by the second reflecting surface; a phase detector for detecting the difference in phase between the first interference signal and the second interference signal; and a wavelength stabilizer for stabilizing the wavelength of the light source by keeping constant the phase difference detected by the phase detector.

According to another aspect of the invention, there is provided a wavelength stabilizing light source apparatus comprising: light sources for emitting coherent light beams; drivers for driving the light source in pulses; a beam splitter for splitting the coherent light from the light sources into two optical paths; a scanning mirror located on one of the two optical paths stemming from the beam splitter and made movable in the direction of optical axis; a reflector located on the other optical path stemming from the beam splitter and having a first and a second reflecting surface, the first reflecting surface reflecting light over a first optical path length, the second reflecting surface reflecting light over a second optical path length; a first light receiver for receiving a first interference signal formed from the interference between the coherent light coming from the scanning mirror and the coherent light reflected by the first reflecting surface; a second light receiver for receiving a second interference signal formed from the interference between the coherent light coming from the scanning mirror and the coherent light reflected by the second reflecting surface; sampling parts for sampling at a predetermined timing a first signal from the first light receiver and a second signal from the second light receiver in effect when the scanning mirror scans the light received; a phase detector for detecting the difference in phase between a first and a second sampling signal, the first and the second sampling signal being generated by the sampling parts when the sampling parts sample the first and the second signal, respectively; and wavelength stabilizers for stabilizing the wavelength of the light sources by keeping constant the phase difference detected by the phase detector.

In a preferred structure according to the invention, the first light receiver receives the first interference signal derived from two coherent light beams: one beam obtained from the coherent light reflected by the scanning mirror reflecting the light from a continuously emitting (DC-driven) light source, the other beam obtained from the coherent light reflected by the first reflecting surface of the reflector. The second light receiver receives the second interference signal derived likewise from two coherent light beams: one light beam obtained from the coherent light reflected by the scanning mirror, the other beam obtained from the coherent light reflected by the second reflecting surface of the reflector. The wavelength of the light source is stabilized on the basis of the phase of the first and the second interference signal.

In another preferred structure according to the invention, the first light receiver receives the first interference signal derived from two coherent light beams: one beam obtained from the coherent light reflected by the scanning mirror reflecting the light from a pulsating light source, the other beam obtained from the coherent light reflected by the first reflecting surface of the reflector. The second light receiver receives the second interference signal derived likewise from two coherent light beams: one light beam obtained from the coherent light reflected by the scanning mirror, the other beam obtained from the coherent light reflected by the second reflecting surface of the reflector. The first signal from the first light receiver and the second signal from the second light receiver are sampled in order to produce the first and the second sampling signal, respectively. The phase difference between the first and the second sampling signal is detected and kept constant, whereby the wavelength of the light source is stabilized.

More specifically, the invention is applied illustratively to a fringe scan interferometer having optical means for forming a predetermined optical path difference. The interferometer is used illustratively in a wavelength stabilizing light source apparatus of a simple construction such as a wavelength stabilizing semiconductor laser device. In operation, the phase difference between two fringe scan interference signals from two different optical paths is kept constant so that the oscillation wavelength of the semiconductor laser device is stabilized. Another application of the invention includes a light source wherein a plurality of pluse-driven semiconductor laser devices that oscillate alternately are stabilized simultaneously in oscillation wavelength. In yet another application, the inrush current to a light source such as the semiconductor laser is modulated so that two different stabilized wavelengths are obtained from that source.

However, these wavelength stabilizing light source apparatuses are vulnerable to changes in ambient conditions. Such changes can vary the optical path length by a stage-distance or stagger or a two-stage or staggered mirror, when the thermal expansion of the glass and the refractive index of the air along the optical paths vary, the length difference between the optical paths used as the wavelength reference also changes. This means that to maintain the wavelength stability for extended periods of time requires safeguarding the staggered mirror itself against temperature fluctuation or other external disturbances.

It is therefore another object of the invention to provide an optical path length difference forming device used with the wavelength stabilizing light source apparatus to enhance the resistance of the latter to ambient changes.

According to a further aspect of the present invention, there is provided an optical path length difference forming device for forming a predetermined difference in length between a first optical path and a second optical path, the device comprising: a first member for constituting the first optical path; and a second member for constituting the second optical path; wherein the following mathematical expression is satisfied so as to keep constant the difference in length between the first optical path and the second optical path despite changes in temperature:

$$\{\Delta L_2(n_2+\Delta n_2)-\Delta L_1(n_1+\Delta n_1)\}+(\Delta n_2 L_2-\Delta n_1 L_1)=(n+\Delta n(\times(h_1+\Delta L_2-\Delta L_1)-n\times h_1$$

where, $L_1$: length of the first member $\Delta L_1$: amount of change in length of the first member upon temperature change $L_2$: length of the second member $\Delta L_2$: amount of change in length of the second member upon temperature change $n_1$: refractive index of the first member $\Delta n_1$: amount of change in refractive index of the first member upon temperature change $n_2$: refractive index of the second member $\Delta n_2$: amount of change in refractive index of the second member upon temperature change $n$: refractive index of the medium occupying the difference in length between the first member and the second member $\Delta n$: amount of change in refractive index of the medium occupying the difference in length between the first member and the second member upon temperature change $h_1$: difference in length between the first member and said second member at reference temperature In a further preferred structure according to the invention, the first member and the second member are made substantially the same in length. With this structure, the first member and the second member are formed preferably from materials of which the expansion coefficients are substantially the same.

In a yet further preferred structure according to the invention, the first and the second member are composed of glass pieces of which the lengths are appropriately the same and of which the thermal expansion coefficient and the refractive index are selected so as to satisfy the above-described mathematical expression.

In another preferred structure according to the invention, the first and the second member are also composed of glass pieces of which the lengths are appropriately the same. With this structure, the thermal expansion coefficients $\alpha_1$ and $\alpha_2$ of the first and the second member are made substantially the same. The glass pieces constituting the first and the second member are selected so that their refractive indices will satisfy the expression above. This structure minimizes the intrusion of an air layer into either optical path upon temperature change, whereby the effect on the optical path length of any change in refractive index of the air resulting from atmospheric pressure fluctuation is minimized.

These and other objects, features and advantages of the invention will become more apparent upon a reading of the following description and appended drawings.

BRIEF DESCRIPTION OF THE DRAWINGS

FIG. 8 is a view of drive waveforms produced by modifications of the above embodiments;

FIGS. 11a and 11b show a view of part of the apparatus in FIG. 10, the part being shown from a different point of view;

FIG. 12 is a view describing parallel beams; and

DESCRIPTION OF THE PREFERRED EMBODIMENTS

Figure 1:
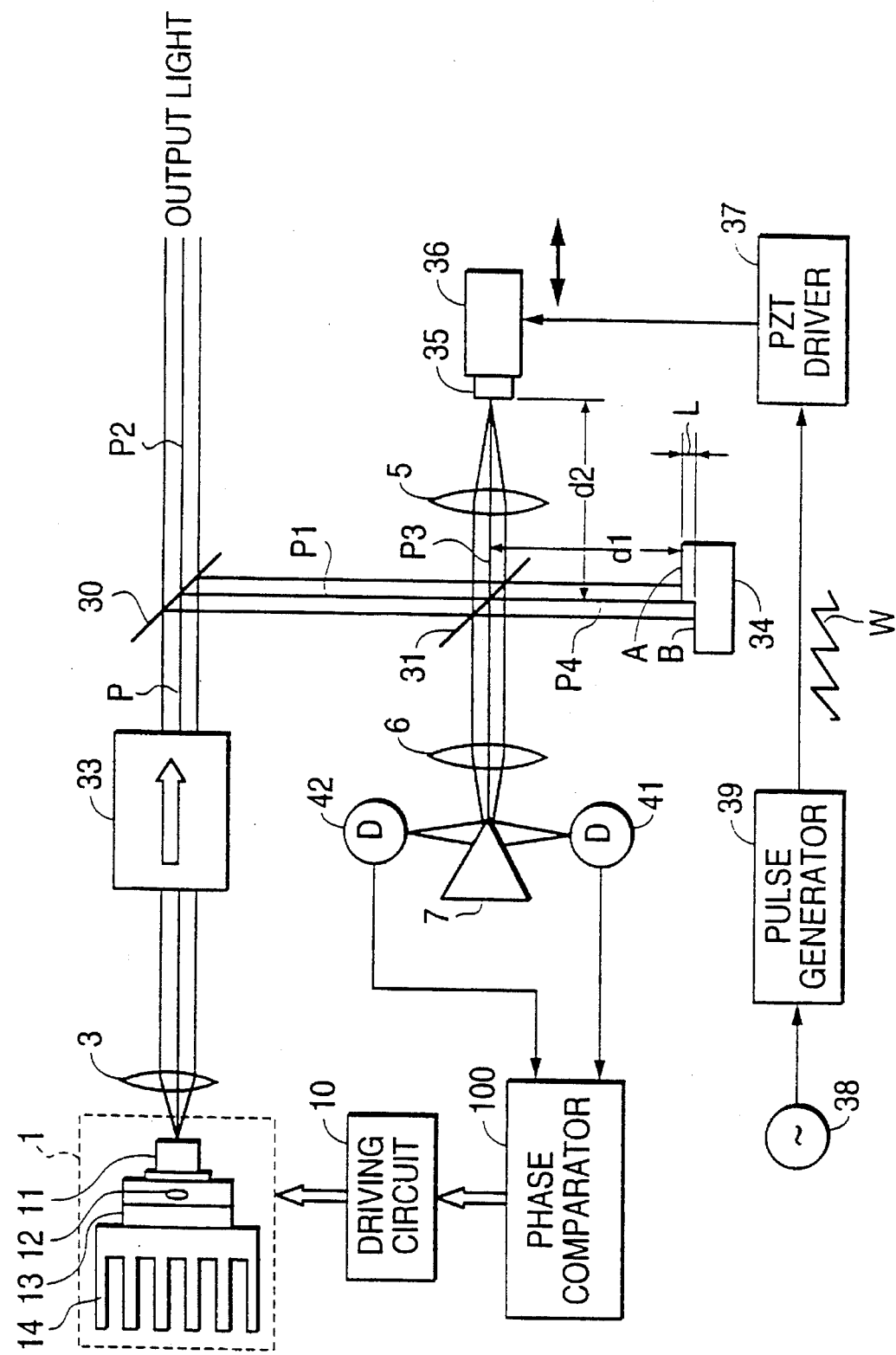
FIG. 1 is a view of a wavelength stabilizing light source apparatus practiced as a first embodiment of the invention.

First Embodiment:

FIG. 1 is a view of a semiconductor laser device which is a wavelength stabilizing light source apparatus practiced as the first embodiment of the invention. In FIG. 1, a light source 1 comprises a semiconductor laser 11, a thermistor 12, a Peltier device 13 and a radiator 14. Continuously emitted light from the light source 1 is collimated by a collimator lens 3. The collimated light passes through an isolator 88. Part of the light from the isolator 88 is reflected by a beam splitter 80 to become light P1, and the rest of the light P passes through the beam splitter 80 to become output light P2.

The light P1 is split by a beam splitter 81 into reflected light P3 and transmitted light P4. The reflected light P3 passes through a condenser lens 5 to be reflected by a scanning mirror 35. The reflected light P3 then goes back over the same optical path to enter the beam splitter 31 again. Transmitted through the beam splitter 31, the reflected light P3 goes to a condenser lens 6. The transmitted light P4 is reflected by a first reflecting surface A and a second reflecting surface B of a staggered mirror 34. Going back over the same optical path, the light P4 from the staggered mirror 84 is reflected by the beam splitter 31. There, the light P3 interferes with the light P4 from the scanning mirror 35. The interfering light from the beam splitter 81 is condensed by the condenser lens 6. There exists the amount of stagger L between the first reflecting surface A and the second reflecting surface B of the staggered mirror 34 which is fixedly mounted. The amount of stagger L is established in the direction of the light P1 and transmitted light P4. The interfering light coming from the first and the second reflecting surface A and B is split by a prism 7 and detected by detectors 41 and 42.

The scanning mirror 35 is attached illustratively to a piezoelectric device 36 such as PZT. The mirror 35 is swept in the arrowed direction of FIG. 1 by the length of a plurality of waves generated by the semiconductor laser 11, the sweeping being effected according to the ramp waves W from an oscillator 38, a pulse signal generator 99 and a PZT driver 37.

It is assumed that the optical path length d2 between the beam splitter 31 and the scanning mirror 35 is substantially the same as the optical path length d1 between the beam splitter 31 and the first reflecting surface A of the staggered mirror 34. The output signal from the detector 41 is a fringe scan signal with an optical path length difference of near 0; the output signal from the detector 42 is a fringe scan signal with an optical path length difference of about 2L. These output signals are used to stabilize the wavelength of the semiconductor laser. Specifically, the two output signals are compared in phase by a phase comparator 100. The phase comparator 100 feeds commands through a light source driving circuit 10 back to the light source 1 so that the two signals will coincide completely in phase.

Figure 2:
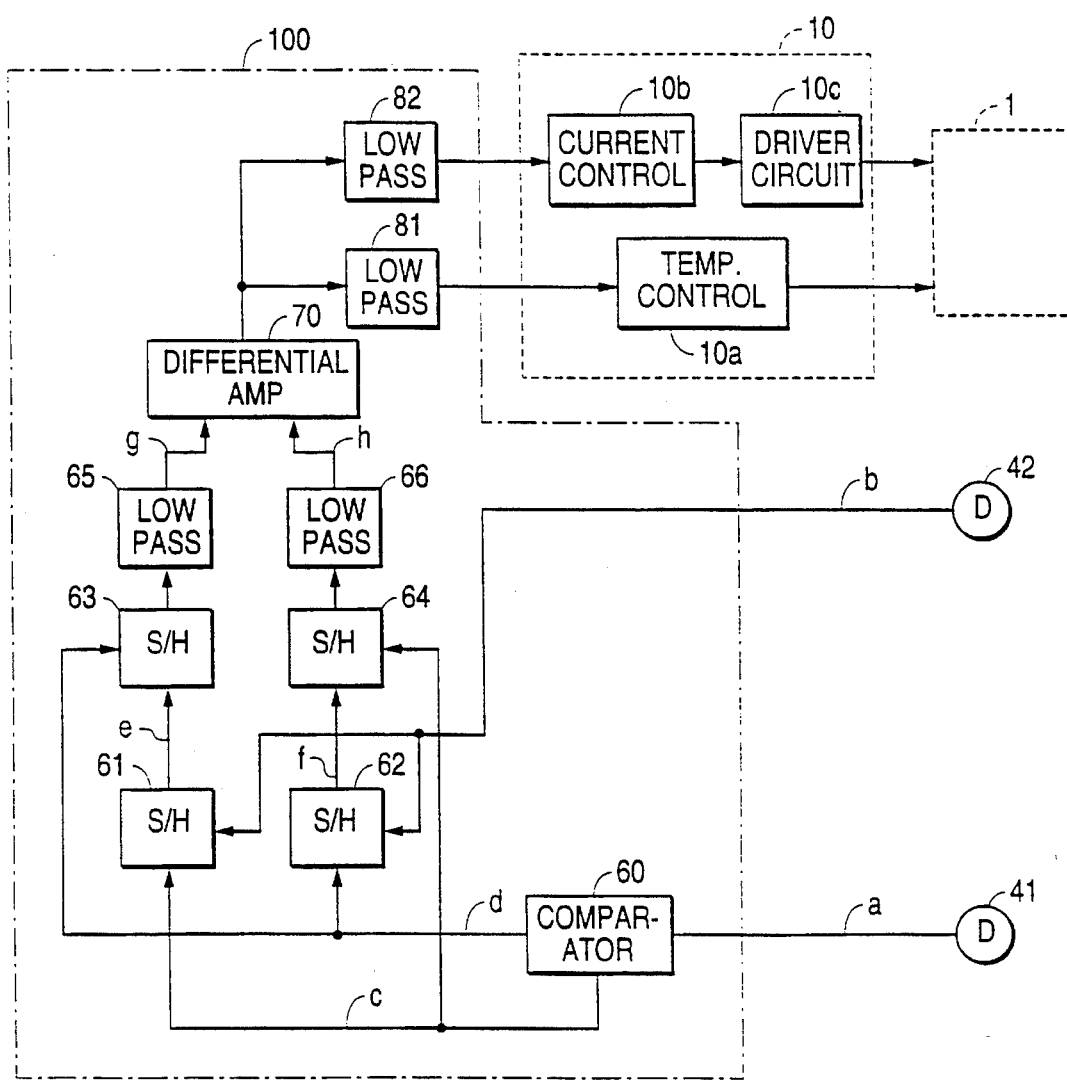
FIG. 2 is a view of the feedback arrangement of the light source in the first embodiment of FIG. 1.
Figure 3:
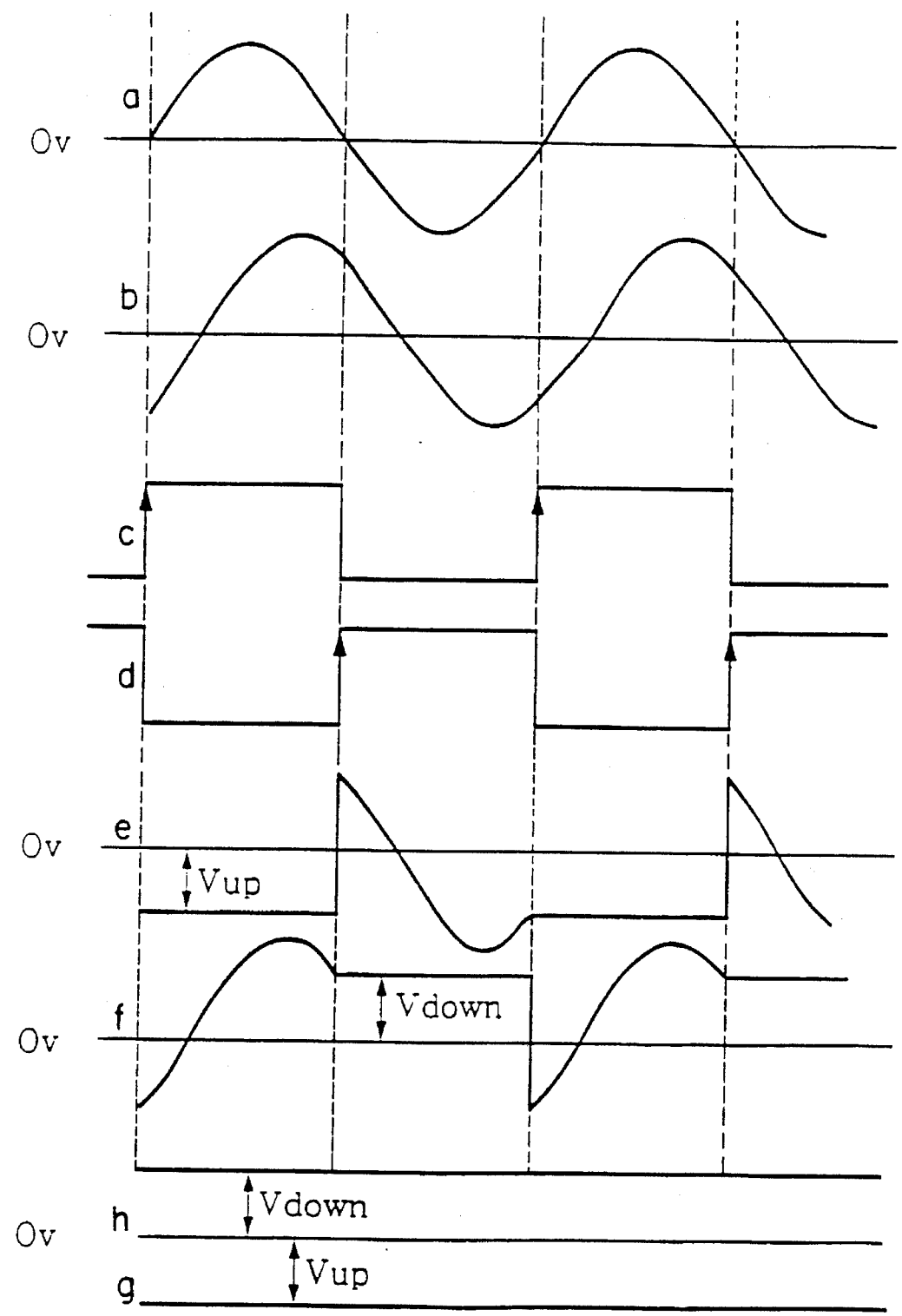
FIG. 3 is a view of waveforms of various signals used in the feedback arrangement of FIG. 2.

The feedback arrangement mentioned above will now be described in more detail. FIG. 2 shows a typical feedback arrangement of the light source in the first embodiment, and FIG. 3 depicts waveforms of various signals used in the feedback arrangement of FIG. 2 (phase lag in the circuit is ignored).

Signals a and b in FIG. 8 are acquired by extracting only the AC component from the outputs of the detectors 41 and 42, respectively. As mentioned, the signal a is the fringe scan signal with the optical path length difference of near 0 and the signal b is the fringe scan signal with the optical path length difference of about 2L. These two signals, compared in phase by the phase comparator 100, are made to coincide with each other in phase by the comparator feeding suitable commands via the light source driving circuit 10 back to the light source 1. With the signals a and b coinciding with each other in phase, the oscillation wavelength of the semiconductor laser 11 in FIG. 1 is stabilized. The two signals are matched in phase by changing the temperature of and the inrush current to the semiconductor laser 11 in order to vary the oscillation wavelength λ appropriately.

The signal a from the detector 41 is converted by a comparator 80 into two square wave signals c and d with their phases made opposite to each other. The signal b from the detector 42 is sampled and held by sample hold circuits 61 and 62 at leading edges of the signals c and d. The sampled-and-held signals from the sample hold circuits 61 and 82 are output signals e and f of FIG. 3, respectively.

The held portions of the output signals e and f are further sampled by sample hold circuits 63 and 64 and sent to low-pass filters 65 and 66. The low-pass filters 65 and 66 provide outputs g and h shown in FIG. 3, respectively. The outputs, g and h are amplified differentially by a differential amplifier 70. The resulting signal from the amplifier 70 is a feedback signal reflecting the phase difference between the signals a and b. Returning the feedback signal to suitable temperature and/or inrush current adjusting arrangements of the light source stabilizes the oscillation wavelength thereof.

The circuit construction of FIG. 2 is an example in which the feedback signal is fed to both the temperature and the inrush current adjusting arrangements. In this example, the output of the differential amplifier 70 is fed to two low-pass filters 81 and 82 having different time constants and different amplification degrees. The filters 81 and 82 in turn output feedback signals reflecting the phase difference between the signals a and b. The output of the low-pass filter 81 is fed through a temperature control circuit 10a back to the light source 1; the output of the low-pass filter 82 is fed through a current control circuit 10b and a driving circuit 10c back to the light source 1. Because of its slow response, the feedback signal for temperature control is given a longer time constant. And because it has a high wavelength change rate, the temperature control feedback signal is used for coarse adjustment. By contrast, because of its high response, the feedback signal for current control is given a shorter time constant. Having a small wavelength change rate, the current control feedback signal is used for fine adjustment.

The signal a is expressed by Expression 1 and the signal b by Expression 2:

$$a = \sin\left[ 2\pi\left\{ \frac{2(d1-d2)}{\lambda} - \frac{2\alpha(t)}{\lambda} \right\} \right] \quad \text{Expression 1}$$

$$b = \sin\left[ 2\pi\left\{ \frac{2(d1-d2)}{\lambda} + \frac{2L}{\lambda} - \frac{2\alpha(t)}{\lambda} \right\} \right] \quad \text{Expression 2}$$

where, α (t) denotes the amount of movement (arrowed direction in FIG. 1) of the scanning mirror 35. To match the two signals a and b in phase requires that 2L/λ=n (n is an integer). The oscillation wavelength λ is fixed to 2L/n. Because an incorrect value of n causes a different wavelength to be established, the temperature of the semiconductor laser 11 needs to be controlled within a certain temperature range with reference to a predetermined temperature (a temperature level with ho mode hop nearby). That controlled temperature range is determined by two factors: dependency of oscillation wavelength of the semiconductor laser on temperature, and the amount of stagger L. The longrterm stability of the oscillation wavelength is enhanced illustratively by controlling the temperature of the staggered mirror 34 so as to minimize any change in the amount of stagger L thereof.

In the manner described, the signals a and b from the detectors 41 and 42 are matched in phase and the oscillation wavelength λ of the semiconductor laser 11 is locked to 2L/n. With the first embodiment, the scanning mirror 35 need only scan the interference fringes. There is no need to consider the nonlinearity, amplitude fluctuation or origin displacement of the scanning mirror 35. The effect of such movements as yawing of the scanning mirror 35 is offset by use of the condenser lens 5 having an appropriate focal distance in front of the mirror, as shown in FIG. 1.

Thus the oscillation wavelength of the semiconductor laser is stabilized by matching in phase the two fringe scan signals a and b derived from different optical path lengths in a two-beam interferometer. When combined with an automatic power control (APC) circuit, the above setup provides a wavelength/output stabilizing light source apparatus based on the semiconductor laser.

It should be noted that the first embodiment shown in FIGS. 1 through 8 is an application wherein one semiconductor laser (light source) is driven for continuous oscillation (i.e., DE-driven).

Figure 4:
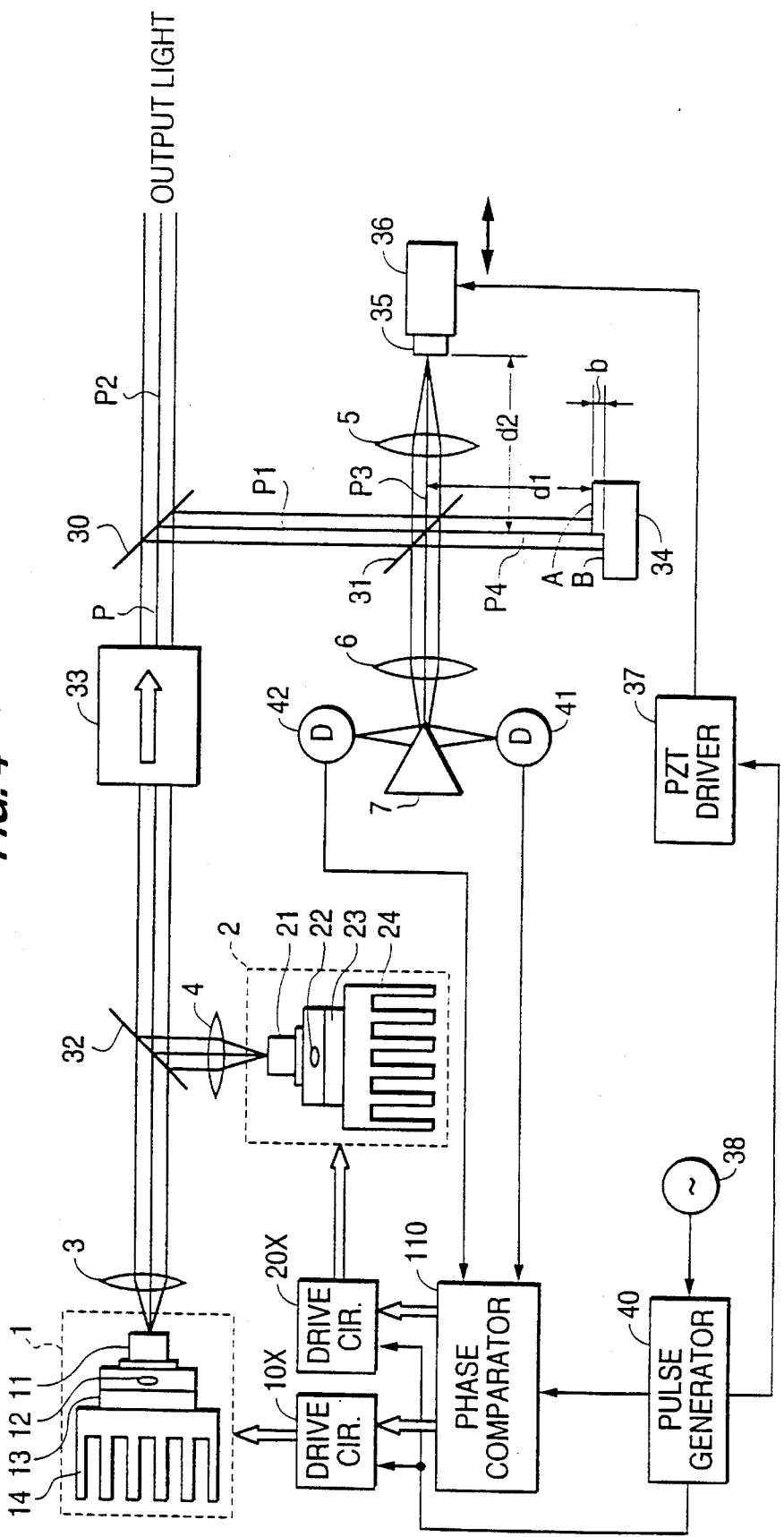
FIG. 4 is a view of a wavelength stabilizing light source apparatus practiced as a second embodiment of the invention.
Figure 5:
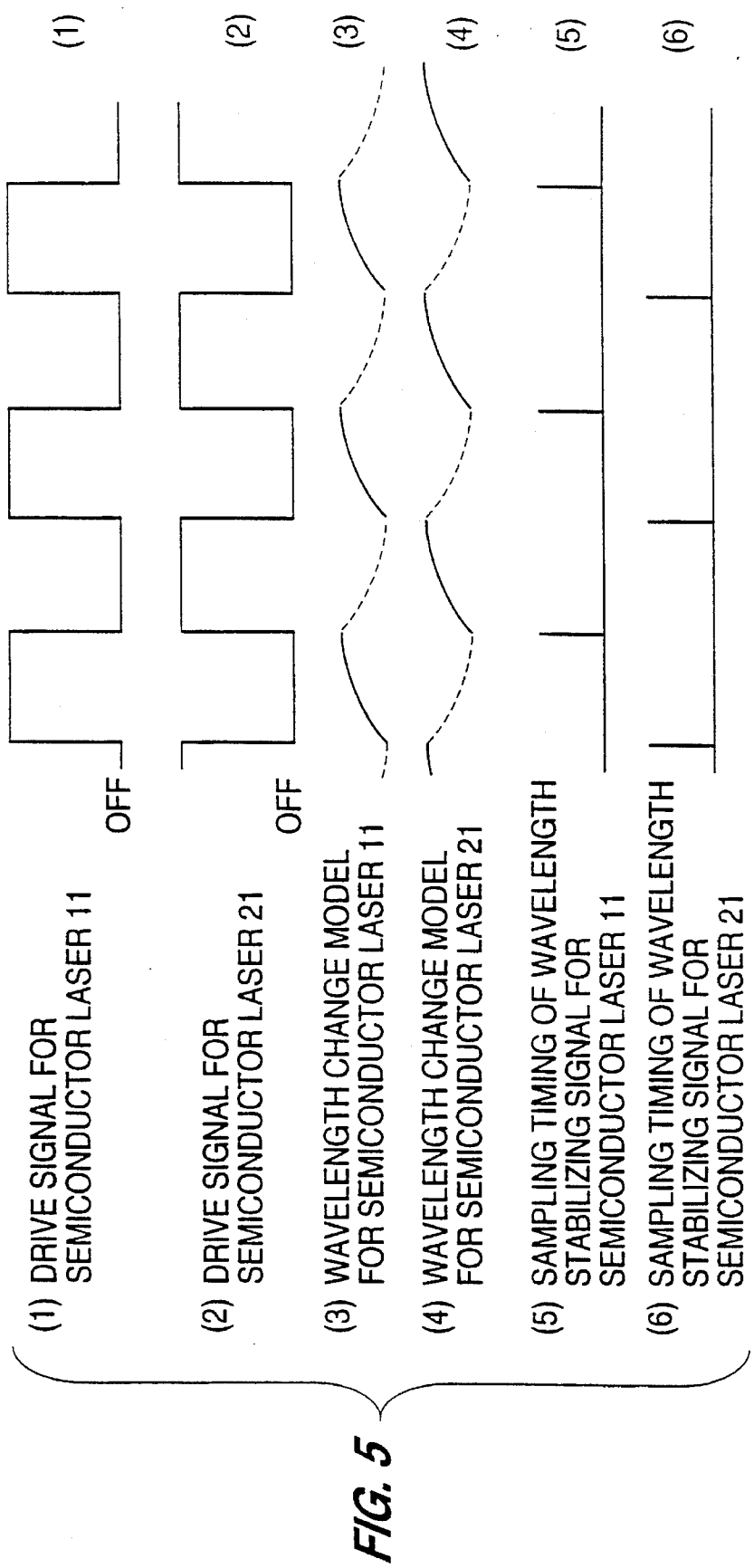
FIG. 5 is a view of waveforms of drive signals and other signals used in the light source of FIG. 4.

Second Embodiment:

The wavelength stabilizing light source apparatus according to the invention is effective not only when the light source thereof is DC-driven but also when pulse-driven. FIG. 4 depicts a wavelength stabilizing light source apparatus practiced as the second embodiment of the invention. With the second embodiment, a plurality of semiconductor lasers (light sources) that oscillate alternately in FIG. 4 are stabilized simultaneously.

The example of FIG. 4 is a two-semiconductor laser setup furnished here for the sake of simplicity. This, however, is not limitative of the invention; three or more semiconductor lasers may be employed instead. Of the components of the second embodiment in FIG. 4, those also shown in the first embodiment of FIG. 1 are designated by like reference numerals.

In FIG. 4, reference numeral 2 is a second light source; 10X and 20X are light source driving circuits that drive the first and the second light source 1 and 2, respectively; 40 is a pulse signal generator that generates various pulse signals; and 110 is a phase comparator.

The light from the light source 2 is collimated by a collimator lens 4 to share at a beam splitter 32 the same optical axis with the light from the light source 1. Semiconductor lasers 11 and 21 of the light sources 1 and 2 are pulse-driven by signals (1) and (2) of FIG. 5, respectively. The resulting waveforms (3) and (4) from the semiconductor lasers 11 and 21 indicate that the pulsated laser beams have their wavelengths constantly changed. In this case, the pulsated signals are stabilized in wavelength with a constant timing. Specifically, signals are extracted from the outputs of the detectors 41 and 42 at respective timings of (5) and (8) in FIG. 5, and the wavelengths of the signals are stabilized at these timings. The sweep frequency of the scanning mirror 35 is sufficiently lower than that of the signals (1) and (2).

Figure 6:
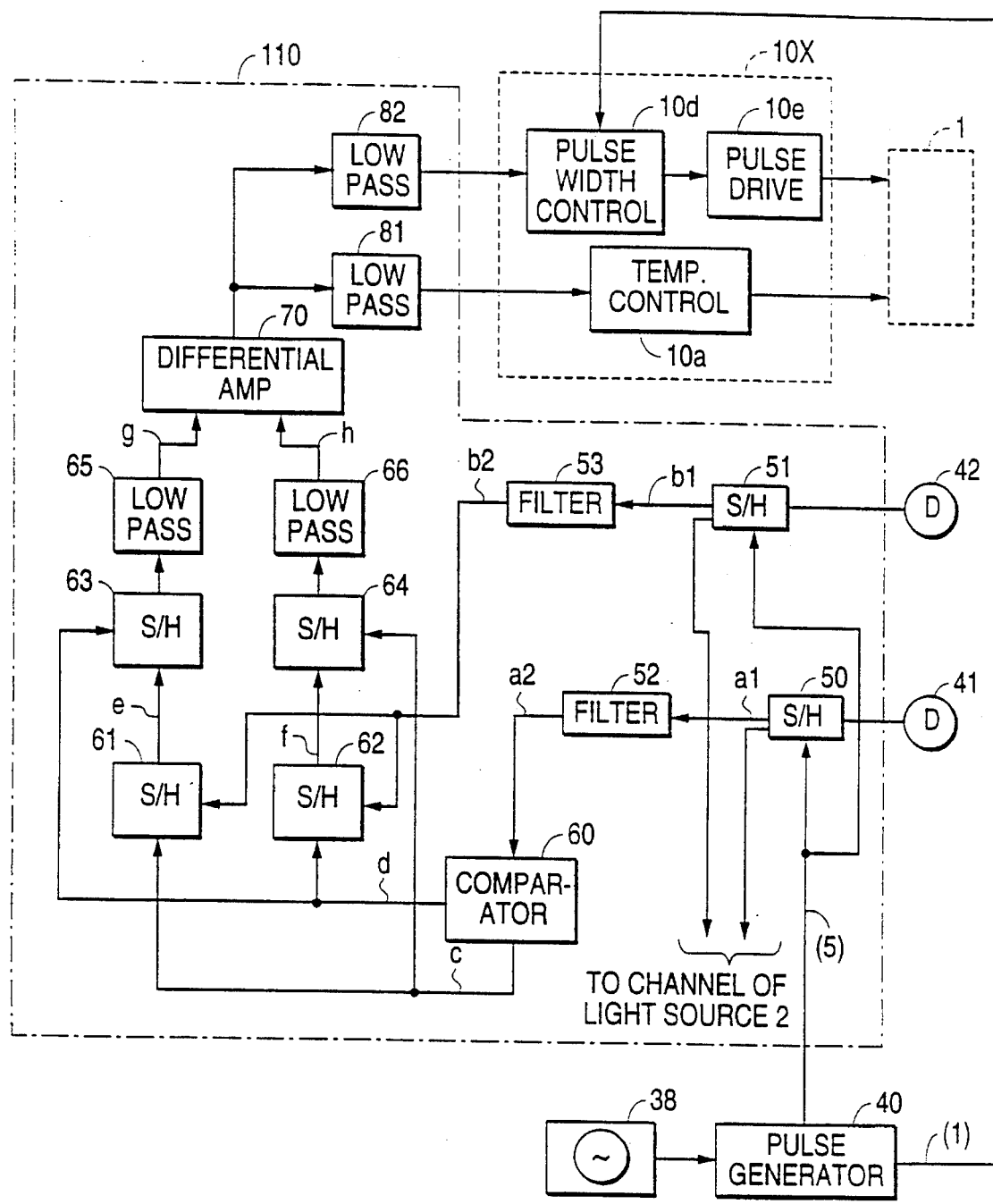
FIG. 6 is a view of the feedback arrangement of the light source in FIG. 4.

FIG. 8 shows a typical construction of the feedback arrangement of the light source in the second embodiment. In FIGS. 6 and 2, like reference numerals designate like or corresponding parts. Although FIG. 6 indicates only the light source 1 for the sake of simplicity, the feedback arrangement for the light source 2 is identical to what is shown here.

Figure 7A:
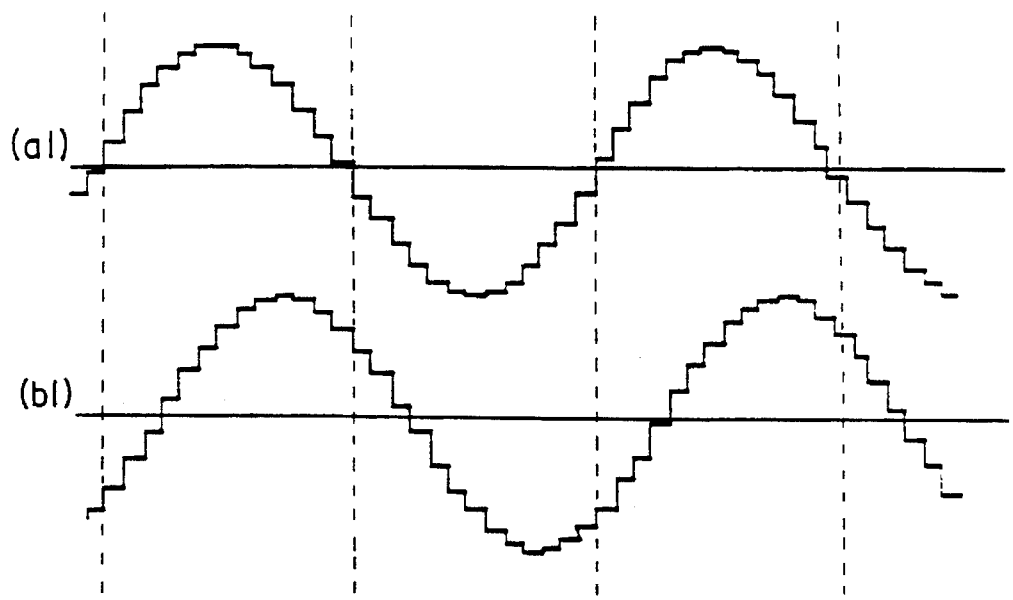
FIGS. 7a and 7b show waveforms of sampled-and-held signals and waveform-shaped signals used in the feedback arrangement of FIG. 6.
Figure 7B:
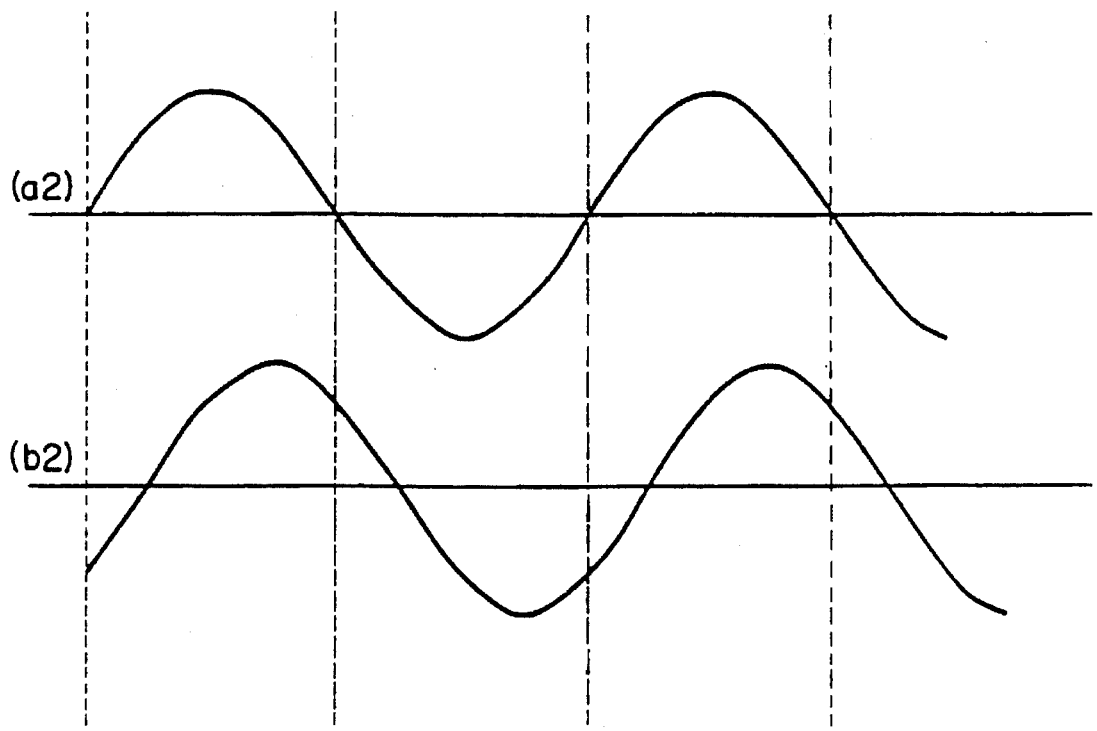

The outputs of the detectors 41 and 42 are sampled and held by sample hold circuits 50 and 51 using the timing signal (5). The sample hold circuits 50 and 51 yield outputs a1 and b1 of FIG. 7a, respectively. Having the outputs a1 and b1 pass through filters 52 and 53 provides outputs a2 and b2, respectively, as shown in FIG. 7b. The outputs a2 and b2 are equivalent to the fringe scan signals (signals a and b in FIG. 8) discussed in connection with the first embodiment wherein the light source is DC-driven. From that point on, the same signal processing as that in the first embodiment is carried out for wavelength stabilization. The same applies to the light source 2. The sample hold circuits 50 and 51 and the filters 52 and 53 constitute a sampling arrangement dealing with the outputs of the detectors 41 and 42.

Where the semiconductor laser device is to be pulse-driven, as is the case with the second embodiment, the same effect as stated above is also achieved by a feedback method for controlling pulse width. Suppose that the timing signals (5) and (6) as well as the drive pulse signals (1) and (2) are fixed in their extinction timings. In that case, the drive pulse signals (1) and (2) are varied in light emission timings so as to change the waveforms (3) and (4) in wavelength. That in turn varies the oscillation wavelength. These relations are utilized in implementing the necessary feedback loop.

As shown in FIG. 6, the output of the low-pass filter 81 is fed through the temperature control circuit 10a back to the light source 1, as described earlier. The output of the low-pass filter 82 is fed through a pulse width control circuit 10d and a pulse driving circuit 10e back to the light source 1. In this example, the maximum duty factor for the pulse width is 50. Because this feedback method achieves wavelength stabilization by controlling temperature and pulse width, control of the inrush current may be relegated to the APC alone.

As described, the pulse-driven semiconductor laser may be stabilized in wavelength at a constant timing. Likewise, a plurality of wavelength stabilizing semiconductor lasers that oscillate alternately may also be implemented. When light is extracted using the same timing from the output light of the multiple light sources for signal processing, the multiple signals of different wavelengths are made available simultaneously.

In the feedback loop, the oscillation wavelengths λ1 and λ2 of the semiconductor lasers 11 and 21 using the constant timing are fixed as shown by Expressions 3 and 4 below:

Expression 3

$$\lambda 1=2L/n1$$

Expression 4

$$\lambda 2=2L/n2$$

where n1 and n2 are an integer each. If the two wave-lengths are synthesized, the synthesis wavelength Λ is given by Expression 5

Expression 5

$$\Lambda=(\lambda 1\cdot\lambda 2)/|\lambda 1-\lambda 2|=2L/-n2-n1|=2L/n$$

Because the wavelength Λ is fixed to 2L/n, selecting two appropriate semiconductor lasers produces the synthesis wavelength desired.

In another variation of the above-described pulse-driven semiconductor laser setup, two different wavelengths may be derived from one semiconductor laser. FIG. 8 is a view of drive waveforms produced by modifications of the above embodiments. In FIG. 8, waveform 1 is derived from one semiconductor laser, while waveform 2 is furnished where two semiconductor lasers are employed. By the method described, the oscillation wavelength is stabilized at a timing A. At that point, the inrush current is raised (or reduced) so as to acquire a different wavelength at a timing B. Because the wavelength at the timing B differs only slightly from that at the timing A, the wavelength at the timing B is stabilized by controlling the current value (for raising or lowering the inrush current) so as to keep an appropriate phase difference between the outputs a2 and b2 of the filters 52 and 53 in FIG. 6. Alternatively, the wavelength is stabilized by simply keeping the current value accurate (for raising or lowering the inrush current). The latter scheme is sufficient where the composite wavelength is to be acquired from the wavelengths at the timings A and B. If the wavelengths at the timings A and B are denoted respectively by $\lambda A$ and $\lambda B$, the synthesis wavelength is expressed as $$(\lambda \cdot \lambda B)/|\lambda A - \lambda B|$$

The stability is determined for the most part by $$\lambda A - \lambda B$$

Thus if the current value is stable, the fluctuation of the synthesis wavelength is small since the wavelength $\lambda B$ varies in keeping with the wavelength $\lambda A$.

As described, the second embodiment of the invention allows the inrush current to the semiconductor laser setup to be modulated so that two different wavelengths are acquired stably from one semiconductor laser. In the description above, the outputs of the detectors 41 and 42 are made to coincide in phase with each other. Alternatively, a predetermined phase difference may be maintained between the two outputs. The optical means to implement the optical path length difference L is not limited to the staggered mirror 34; other means may also be adopted. Furthermore, the circuit construction for generating the signals corresponding to the phase difference and the methods for processing the signals are not limitative of the invention.

With the first embodiment of the invention, part of the DC-driven light from the source is extracted and made to enter the fringe scan interferometer. The interferometer has optical means for forming a predetermined length difference between two optical paths, and two light receivers for detecting the interference signals from the two optical paths. The phase difference between two signals from the two light receivers is kept constant so that the oscillation wavelength is stabilized in a simply constructed semiconductor laser device.

With the second embodiment of the invention, part of the pulse-driven light from the source is extracted and made to enter the fringe scan interferometer. The interferometer has optical means for forming a predetermined length difference between two optical paths, and two light receivers for detecting the interference signals from the two optical paths. The output signals of the two light receivers are sampled at a constant timing. The phase difference between the two sampled signals is kept constant so that the oscillation wavelength is stabilized at a constant timing in a simply constructed semiconductor laser device.

In the pulse-driven setup, a plurality of semiconductor lasers may be stabilized simultaneously in wavelength at constant timings. This provides for a wavelength stabilizing semiconductor laser apparatus comprising multiple semiconductor lasers that oscillate alternately.

Furthermore, the inrush current to one semiconductor laser may be modulated. This makes it possible to acquire two different wavelengths oscillated alternately and in stable fashion from one semiconductor laser.

Figure 9:
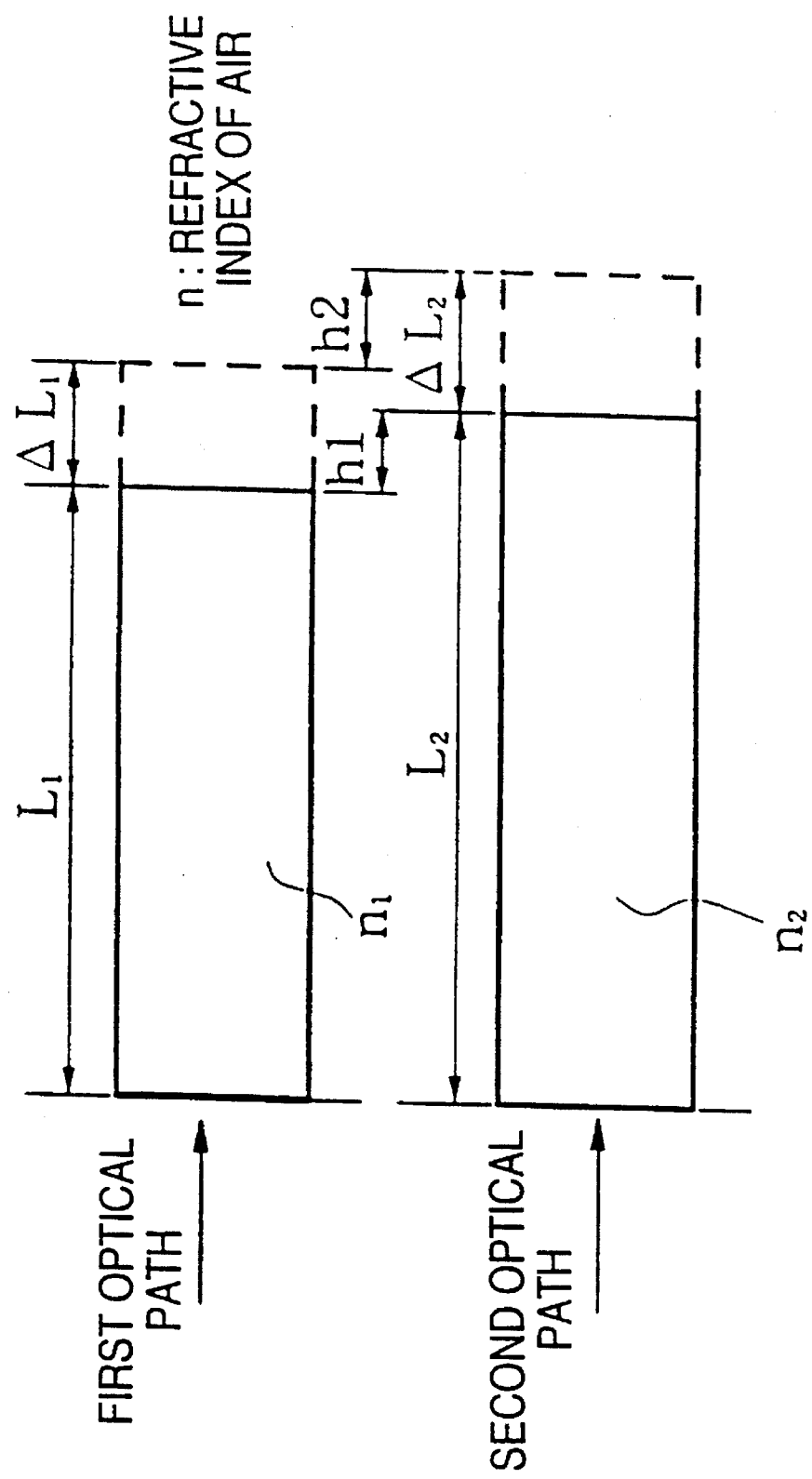
FIG. 9 is a view illustrating the operating principle of an optical path length difference forming device practiced as a third embodiment of the invention.

Third Embodiment:

Described below with reference to FIG. 9 is the operating principle of an optical path length difference forming device practiced as the third embodiment of the invention. The third embodiment forms a predetermined difference in length between a first optical path and a second optical path. The third embodiment comprises a first member for constituting the first optical path, and a second member for constituting the second optical path. With this constitution, the following Expression 6 is satisfied so as to keep constant the difference in length between the first optical path and the second optical path despite changes in temperature:

Expression 6

$$\{\Delta L_2(n_2+\Delta n_2)-\Delta L_1(n_1+\Delta n_1)\}+(\Delta n_2 L_2-\Delta n_1 L_1)=(n+\Delta n)\times (h_1+\Delta L_2-\Delta L_1)-n\times h_1$$

where, $L_1$: length of the first member $\Delta L_1$: amount of change in length of the first member upon temperature change $L_2$: length of the second member $\Delta L_2$: amount of change in length of the second member upon temperature change $n_1$: refractive index of the first member $n_1$: amount of change in refractive index of the first member upon temperature change $n_2$: refractive index of the second member $\Delta n_2$: amount of change in refractive index of the second member upon temperature change n: refractive index of the medium occupying the difference in length between the first member and the second member $\Delta n$: amount of change in refractive index of the medium occupying the difference in length between the first member and the second member upon temperature change, $h_1$: difference in length between the first member and the second member at reference temperature More specifically, Expression 6 is acquired as follows. When, at reference temperature, the optical path lengths of the first and the second member made of glass are denoted by $La_1$ and $La_2$, respectively, one gets:

$$La_1 = n_1 \times L_1$$

$$La_2 = n_2 \times L_2$$

where $L_1$ and $L_2$ are the lengths of the first and the second member and $n_1$ and $n_2$ are the refractive indices thereof, respectively, as mentioned.

The difference in length between the optical paths is given by the following expression:

Expression 7

$$La = La_2 La_1 - nh_1 = n_2 \times L_2 - n_1 \times L_1 - n \times h_1$$

The optical path length difference is the difference in length between the first and the second member when they are both longest. Where the members are made of glass and are shorter, they contain an air layer ($n \times h_1$), where n stands for the refractive index of the air and $h_1$ for the difference in length between the first and the second member. Suppose that $Lb_1$ and $Lb_2$ designate the optical path lengths of the first and the second member, respectively, in effect when the temperature has varied by $\Delta t$. Given the temperature change, $\alpha_1$ and $\alpha_2$ denote the thermal expansion coefficients of the first and the second member, respectively; $\beta_1$, $\beta_2$ and $\beta_3$ designate the temperature coefficients for the refractive indices of the first member, the second member and the air, respectively.

$$Lb_1 = (n_1 + \beta_1 \Delta t) \times L_1 \times (1 + \alpha_1 \Delta t) = (n_1 + \Delta n_1) \times (L_1 + \Delta L_1)$$

$$Lb_2 = (n_2 + \beta_2 \Delta t) \times L_2 \times (1 + \alpha_2 \Delta t) = (n_2 + \Delta n_2) \times (L_2 + \Delta L_2)$$

where, $$\Delta n_1 = \beta_1 \Delta t, \ \Delta n_2 = \beta_2 \Delta t$$

$$\Delta L_1 = L_1 \alpha_1 \Delta t, \ \Delta L_2 = L_2 \alpha_2 \Delta t$$

The optical path length difference $\Delta Lb$ is obtained by the following expression:

$$\Delta Lb = Lb2 - Lb1 - (n + \beta \Delta t) \times h1 = Lb2 - Lb1 - (n + \quad \text{Expression 8}$$
$$\Delta n) \times h2 = Lb2 - Lb1 - (n + \Delta n) \times (h1 + \Delta L2 - \Delta L1) =$$
$$(n2 + \Delta n2) \times (L2 + \Delta L2) - (n1 - \Delta n1) \times (L1 + \Delta L1) -$$
$$(n + \Delta n) \times (h1 + \Delta L2 - \Delta L1)$$

where $h_2$ stands for the difference in length between the first and the second member made of glass, the difference being in effect when the temperature has varied by $\Delta t$. The length difference $ha$ is expressed as $$h_2 = h_1 + \Delta L_2 - \Delta L_1$$

Expression 9 below is used to obtain the amount of change $\Delta L$ between the optical path length difference $\Delta La$ at reference temperature and the optical path length difference $\Delta Lb$ in effect when the temperature has varied by $\Delta t$.

$$\Delta L = \Delta Lb - \Delta La = \quad \text{Expression 9}$$
$$(n2 + \Delta n2) \times (L2 + \Delta L2) - (n1 + \Delta n1) \times$$
$$(L1 + \Delta L1) - (n + \Delta n) \times (h1 + \Delta L2 - \Delta L1) -$$
$$\{n2 \times L2 - n1 \times L1 - n \times h1\}$$
$$= (n2 \times \Delta L2 + \Delta n2 \times L2 + \Delta n2 \times \Delta L2) -$$
$$(n1 \times \Delta L1 + \Delta n1 \times L1 + \Delta n1 \times \Delta L1) - n \times$$
$$(\Delta L2 - \Delta L1) - \Delta n \times (h1 + \Delta L2 - \Delta L1)$$
$$= \{\Delta L2(n2 + \Delta n2) - \Delta L1(n1 + \Delta n1)\} +$$
$$(\Delta n2 \times L2 - \Delta n1 \times L1) - (n + \Delta n) \times$$
$$(h1 + \Delta L2 - \Delta L1) + n \times h1$$

When $\Delta L = 0$, there obviously is no optical path length difference resulting from temperature change.

The ideal state is assumed to be one in effect when $\Delta L = 0$. In that state, transposing terms appropriately in the expression above provides Expression 6. In Expression 6, the first term on the left represents the difference between two values: one value derived from the amount of change $\Delta L_2$ in length of the second member upon temperature change $\Delta t$, multiplied by the amount of change $\Delta n_2$ in refractive index of the second member upon temperature change $\Delta t$ plus the refractive index of the second member $n_2$; the other value derived from the amount of change $\Delta L_1$ in length of the first member upon temperature change $\Delta t$, multiplied by the amount of change $\Delta n_1$ in refractive index of the first member upon temperature change $\Delta t$ plus the refractive index of the first member $n_1$. The second term on the left of Expression 6 represents the difference between another two values: one value obtained from the length of the second member $L_2$ before temperature change $\Delta t$, multiplied by the amount of change $\Delta n_2$ in refractive index of the second member upon temperature change $\Delta t$; the other value obtained from the length of the first member $L_1$ before temperature change $\Delta t$, multiplied by the amount of change $\Delta n_1$ in refractive index of the first member upon temperature change $\Delta t$. The term on the right in Expression 6 is given as the optical path length of the air layer $(n + \Delta n)h_2$ derived from the difference in length between the first and the second member (made of glass) upon temperature change $\Delta t$, minus the optical path length of the air layer $(n \times h_1)$ derived from the difference in length between the first and the second member (made of glass) before temperature change.

Figure 10:
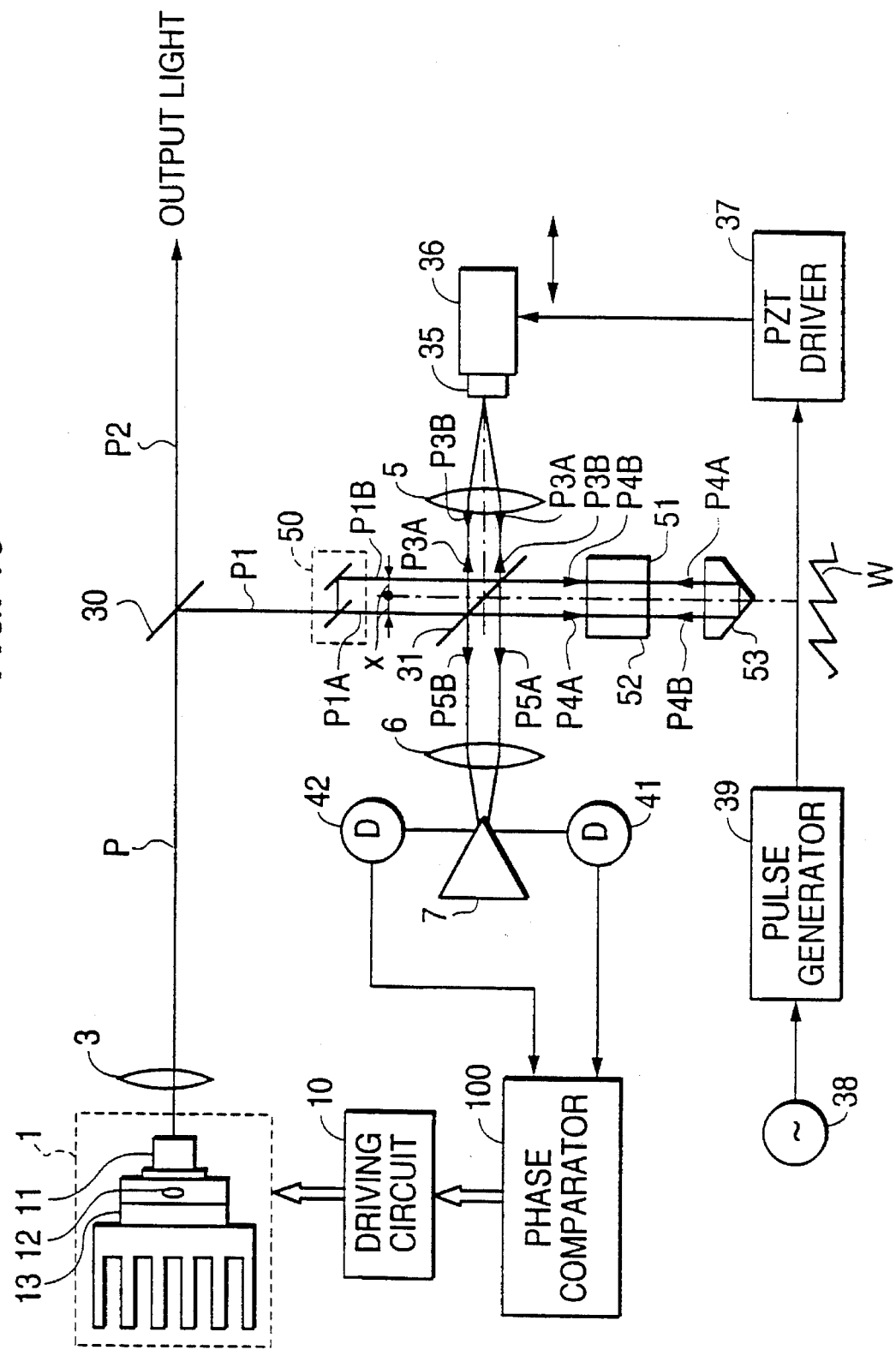
FIG. 10 is a view of a wavelength stabilizing light source apparatus utilizing the third embodiment.

FIG. 10 is a view of a wavelength stabilizing light source apparatus (i.e., semiconductor laser device) utilizing the third embodiment. In FIG. 10 as well as in FIGS. 1 through 8, like reference numerals designate like or corresponding parts.

Part P1 of the emitted light P from the light source 1 is split by a beam splitter 50 into two parallel beams P1A and P1B which are 2x apart (x: appropriate value). These beams are split further by a beam splitter 31 into reflected light beams P3A and P3B as well as into transmitted light beams P4A and P4B.

The optical paths through which the above light beams pass will now be described in more detail with reference to FIGS. 10, 11a and 11b. FIGS. 11a and 11b show a part of the apparatus in FIG. 10, the part being shown from a different point of view. The beams P3A and P3B enter the condenser lens 5 through a path y away from and parallel with the optical axis of the lens 5 (y: appropriate value). The incident beams are reflected by the scanning mirror to leave the condenser lens 5 through another path y away from and parallel with the optical axis of the lens 5. Having left the condenser lens 5, the beams proceed to the beam splitter 81. The condenser lens 5 and scanning mirror 85 constitute what is known as a cat's eye optical system.

The scanning mirror 35 is attached illustratively to the piezoelectric device 36 such as PZT. The mirror 85 is swept in the arrowed direction of FIG. 10 by the length of a plurality of waves generated by the semiconductor laser 11, the sweeping being effected according to the ramp waves W from the oscillator 38, pulse signal generator 39 and PZT driver 37.

Alternatively, the condenser lens 5 and scanning mirror 35 are formed integrally and attached illustratively to the piezoelectric device 36 such as PZT. The lens-mirror assembly is swept in the arrowed direction of FIG. 10 by the length of a plurality of waves generated by the semiconductor laser 11, the sweeping being effected according to the ramp waves W from the oscillator 88, pulse signal generator 39 and PZT driver 37.

The beams P4A and P4B enter a corner cube 53 through a path y away from and parallel with the optical axis of the cube 53. The incident beams and reflected by and leave the corner cube 53 through another path y away from and parallel with the optical axis of the cube 53. The arrangement of FIG. 12, with the values of x and y selected appropriately, is intended to keep the beams P4A and P4B from hitting any ridge of the corner cube 58. Thereafter, the beams P4A and P4B pass through a low- and a high-refractive index glass piece 51 and 52 respectively to reach the beam splitter 31.

The beams P3A and P4A are combined by the beam splitter 31 to become an interfering light beam PSA that is detected by the detector 41. The beams P3B and P4B are also combined by the beam splitter 31 to become an interfering light beam PSB that is detected by the detector 42.

The cat's eye optical system and the corner cube play the same functional rule. It follows that the condenser lens 5 and scanning mirror 35 may be replaced by a corner cube. Alternatively, the corner cube 53 may be replaced by a cat's eye optical system.

In the third embodiment above, the optical axis is shifted by the cat's eye optical system and by the corner cube. This means that there is no light returning to the light source 1. As a result, unlike in the setups of FIGS. 1 through 8, the isolator 33 is not necessary.

Suppose that $L_1$ stands for the length of the low-refractive index glass piece 51 (corresponding to the first member in FIG. 9), $n_1$ for the refractive index of the glass piece 51, $L_2$ for the length of the high-refractive index glass piece 52 (corresponding to the second member in FIG. 9), $n_2$ for the refractive index of the glass piece 52, and n for the refractive index of the air. In this case, the output signal of the detector 41 and that of the detector 42 constitute two fringe scan signals representing the optical path length difference of $\Delta La$. That is, $\Delta La = n_2 \times L_2 - n_1 \times L_1 - n \times (L_2 - L_1)$ where, $L_2 > L_1$.

With the third embodiment, as described, two glass pieces of different refractive indices are used to set the optical path length difference of $\Delta La$ for wavelength stabilization. Here, the properties and the lengths of the glass pieces are determined by use of Expressions 6 through 9 described above. This requires taking into account such factors as the thermal expansion coefficients of the glass pieces and the temperature coefficients for both their refractive indices and the refractive index of the air.

The semiconductor laser 11 is stabilized in wavelength using the two fringe scan signals reflecting the optical path length difference of $\Delta La$ established in the above manner. The two signals are compared in phase by the phase comparator 100. The phase comparator 100 feeds commands back to the light source 1 via the light source driving circuit 10 so that a predetermined phase difference is maintained between the two signals. The feedback arrangement was discussed earlier and is thus omitted hereunder.

Figure 13:
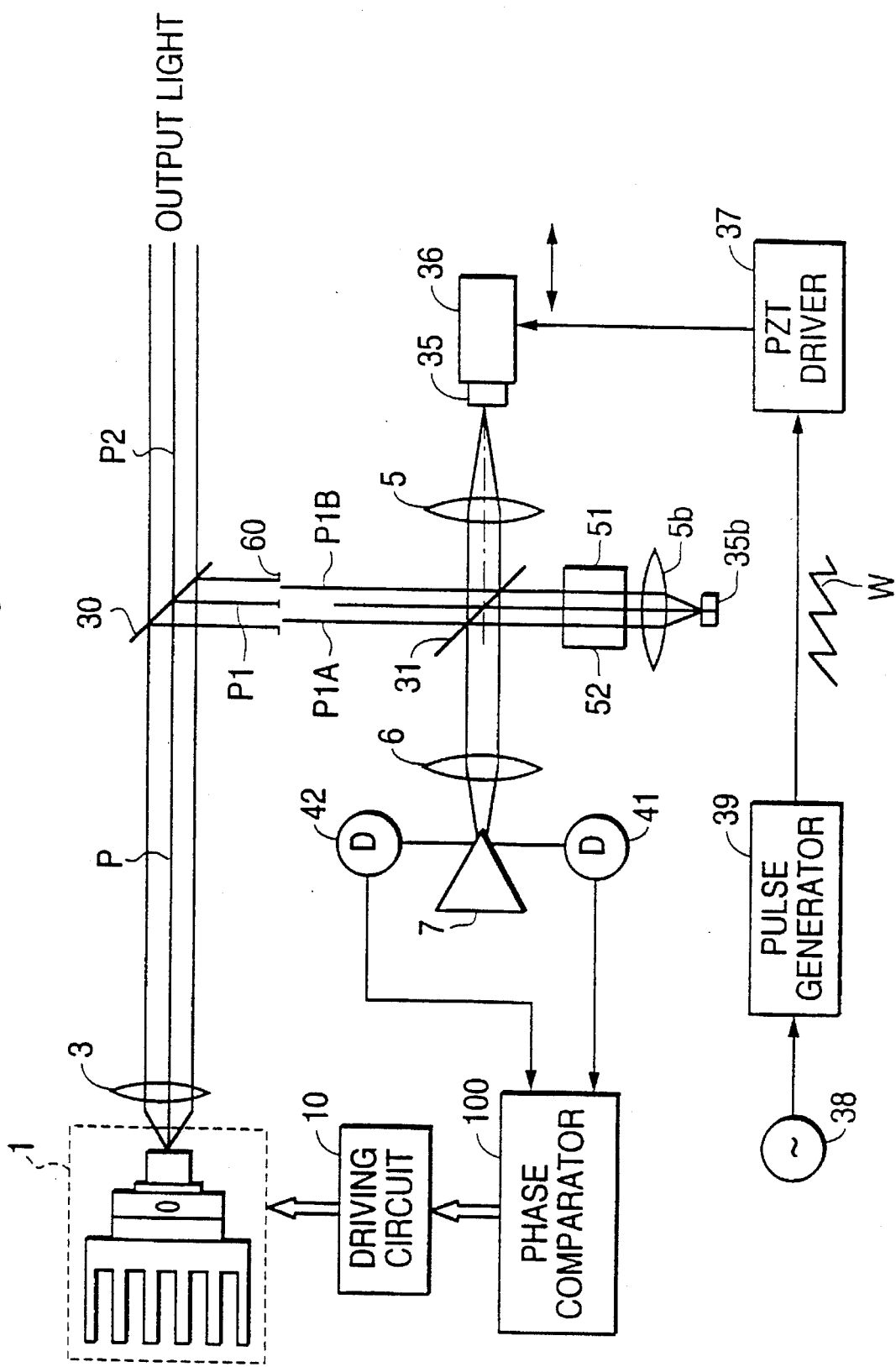
FIG. 13 is a view of a variation of the apparatus in FIG. 10.

In the optical setup of FIG. 10, the beam splitter 10 is used to show distinctly the optical paths through which the light beams pass. Alternatively, as depicted in FIG. 13, the emitted light from the light source 1 may be split into two beams by a diaphragm 60. The position of the diaphragm 60 is not limited to what is shown in FIG. 13; the diaphragm 60 may be alternatively located in front of the detectors.

EXAMPLE 1

Temperature coefficient for refractive index . . . low-refractive index glass>high-refractive index glass Thermal expansion coefficient . . . low-refractive index glass~high-refractive index glass Described below in concrete terms is how to ensure the stability of the optical path length difference $\Delta L$ for wavelength stabilization according to the invention. Suppose that the semiconductor laser 11 is a semiconductor laser having a 780 nm band and that the laser is to stabilize on 760±10 mmHg at 23°±3° C. for reference.

For example, the material of the low-refractive index glass piece 51 may be extra-light flint glass "LLF6" in Table 1, and that the material of the high-refractive index glass piece 52 may be lanthanum flint glass "LaF02" in Table 1. The properties of the materials are as follows:

|  |  | LLF6 | LaF02 |
|---|---|---|---|
| Refractive index (780 nm) | 20° C. | 1.524916 | 1.709736 |
|  | 23° C. | 1.524909 | 1.709733 |
|  | 26° C. | 1.524902 | 1.709730 |
| Temperature coefficient for refractive index (/°C.) |  | $2.3 \times 10^{-6}$ | $1.0 \times 10^{-6}$ |
| Thermal expansion coefficient (/°C.) |  | $8.3 \times 10^{-6}$ | $8.0 \times 10^{-6}$ |

The refractive indices of the air with a wavelength of 780 nm are given below. Since the change in humidity has little effect on the indices, the humidity is assumed here to be 50%.

| Temperature/atmospheric pressure | 750 mmHg | 760 mmHg | 770 mmHg |
|---|---|---|---|
| 20° C. | 1.000268 | 1.000271 | 1.000275 |
| 23° C. | 1.000265 | 1.000268 | 1.000272 |
| 26° C. | 1.000262 | 1.000265 | 1.000269 |

If the lengths of the glass pieces are 19 mm ($=L_1$) and 19.03 mm ($=L_2$), then the optical path length difference $\Delta L$ at 23° C. on 760 mmHg is given as $\Delta L = 1.709733 \times 19.03 - 1.524909 \times 19 - 1.000268 \times (19.03 - 19) = 3.53293995$ mm If the two signals are controlled to coincide in phase with each other, the wavelength $\lambda$ of the semiconductor laser 11 is stabilized at a value of $\Delta L$ reduced by a factor of an integer N. Thus one gets:

N=($\Delta L$/780 nm with fractions rounded)=4529

$\lambda = \Delta L/4529 = 780.0706447$ nm

The integer N is the number of waves contained in the period $\Delta L$. Changing the temperature set for the semiconductor laser 11 allows the integer N to be replaced by another value. That is, another wavelength may be obtained.

With the above calculations taken into consideration, the stability of the optical path length difference $\Delta L$ at 23°±3° C. on 760±10 mmHg is calculated as follows:

| Temperature/atmospheric pressure | 750 mmHg | 760 mmHg | 770 mmHg |
|---|---|---|---|
| 20° C. | 0.025 | −0.0003 | −0.034 |
| 23° C. | 0.025 | — | −0.034 |
| 26° C. | 0.025 | −0.001 | −0.035 |

(unit: ppm)

Thus given the above-mentioned glass combination, the stability of the optical path length difference $\Delta L$ is set at about ±0.04 ppm with respect to a temperature change of ±3° C. and an atmospheric pressure change of ±10 mmHg. This provides for a practically unvarying wavelength reference.

EXAMPLE 2

Temperature coefficient for refractive index . . . low-refractive index glass<high-refractive index glass Thermal expansion coefficient . . . low-refractive index glass>high-refractive index glass Described below is another example of how to ensure the stability of the optical path length difference ΔL for wavelength stabilization according to the invention. Suppose that the semiconductor laser 11 is a semiconductor laser having a 780 nm band and that the laser is to stabilize on 760±10 mmHg at 23°±3° C. for reference.

For example, the material of the low-refractive index glass piece 51 may be flint glass "F5" in Table 1, and that the material of the high-refractive index glass piece 52 may be lanthanum flint glass "LaK18" in Table 1. The properties of the materials are as follows:

|  |  | F5 | LaK18 |
|---|---|---|---|
| Refractive index (780 nm) | 20° C. | 1.593641 | 1.720540 |
|  | 23° C. | 1.593649 | 1.720551 |
|  | 26° C. | 1.593657 | 1.720562 |
| Temperature coefficient for refractive index (/°C.) |  | $2.6 \times 10^{-6}$ | $3.7 \times 10^{-6}$ |
| Thermal expansion coefficient (/°C.) |  | $8.8 \times 10^{-6}$ | $5.9 \times 10^{-6}$ |

The refractive indices of the air with a wavelength of 780 nm are given below. Since the change in humidity has little effect on the indices, the humidity is assumed here to be 50%.

| Temperature/atmospheric pressure | 750 mmHg | 760 mmHg | 770 mmHg |
|---|---|---|---|
| 20° C. | 1.000268 | 1.000271 | 1.000275 |
| 23° C. | 1.000265 | 1.000268 | 1.000272 |
| 26° C. | 1.000262 | 1.000265 | 1.000269 |

If the lengths of the glass pieces are 22.37 mm (=$L_1$) and 22.3 mm (=$L_2$), then the optical path length difference ΔL at 23° C. on 760 mmHg is given as $$\Delta L = 1.720551 \times 22.3 + 1.000268 \times (22.37 - 22.3) - 1.593649 \times 22.37 = 2.78837793 \text{ mm}$$

If the two signals are controlled to coincide in phase with each other, the wavelength λ of the semiconductor laser 11 is stabilized at a value of ΔL reduced by a factor of an integer N. Thus one gets:

N=(ΔL/780 nm with fractions rounded)=3575
λ=ΔL/3575=779.9658545 nm

The integer N is the number of waves contained in the period ΔL. Changing the temperature set for the semiconductor laser 11 allows the integer N to be replaced by another value. In this manner, another wavelength may be obtained.

With the above calculations taken into consideration, the stability of the optical path length difference ΔL at 23°±3° C. on 760±10 mmHg is calculated as follows:

| Temperature/atmospheric pressure | 750 mmHg | 760 mmHg | 770 mmHg |
|---|---|---|---|
| 20° C. | 0.076 | −0.001 | −0.099 |
| 23° C. | 0.075 | — | −0.100 |
| 26° C. | 0.076 | −0.00002 | −0.101 |

(unit: ppm)

Thus given the above-mentioned glass combination, the stability of the optical path length difference ΔL is set at about ±0.1 ppm with respect to a temperature change of ±3° C. and an atmospheric pressure change of ±10 mmHg. The example above also provides for a practically unvarying wavelength reference.

EXAMPLE 3

Temperature coefficient for refractive index . . . low-refractive index glass>high-refractive index glass Thermal expansion coefficient . . . low-refractive index glass<high-refractive index glass Described below is a further example of how to ensure the stability of the optical path length difference ΔL for wavelength stabilization according to the invention. Suppose that the semiconductor laser 11 is a semiconductor laser having a 780 nm band and that the laser is to stabilize on 760±10 mmHg at 23°±3° C. for reference.

For example, the material of the low-refractive index glass piece 51 may be heavy flint glass "SK2" in Table 1, and that the material of the high-refractive index glass piece 52 may be heavy flint glass "SFL14" in Table 1. The properties of the materials are as follows:

|  |  | SK2 | SFL14 |
|---|---|---|---|
| Refractive index (780 nm) | 20° C. | 1.600622 | 1.744507 |
|  | 23° C. | 1.600633 | 1.744510 |
|  | 26° C. | 1.600644 | 1.744513 |
| Temperature coefficient for refractive index (/°C.) |  | $3.6 \times 10^{-6}$ | $0.9 \times 10^{-6}$ |
| Thermal expansion coefficient (/°C.) |  | $6.3 \times 10^{-6}$ | $8.7 \times 10^{-6}$ |

The refractive indices of the air with a wavelength of 780 nm are given below. Since the change in humidity has little effect on the indices, the humidity is also assumed here to be 50% as in the earlier examples.

| Temperature/atmospheric pressure | 750 mmHg | 760 mmHg | 770 mmHg |
|---|---|---|---|
| 20° C. | 1.000268 | 1.000271 | 1.000275 |
| 23° C. | 1.000265 | 1.000268 | 1.000272 |
| 26° C. | 1.000262 | 1.000265 | 1.000269 |

If the lengths of the glass pieces are 26.08 mm (=$L_1$) and 26 mm (=$L_2$), then the optical path length difference ΔL at 23° C. on 760 mmHg is given as $$\Delta L = 1.744510 \times 26 + 1.000268 \times (26.08 - 26) - 1.600633 \times 26.08 = 3.6927728 \text{ mm}$$

If the two signals are controlled to coincide in phase with each other, the wavelength λ of the semiconductor laser 11 is stabilized at a value of ΔL reduced by a factor of an integer N. Thus one gets:

N=(ΔL/780 nm with fractions rounded)=4734
λ=ΔL/4734=780.0534009 nm

The integer N is the number of waves contained in the period ΔL. Changing the temperature set for the semiconductor laser 11 allows the integer N to be replaced by another value. This makes it possible to acquire another wavelength.

With the above calculations taken into consideration, the stability of the optical path length difference ΔL at 23°±3° C. on 760±10 mmHg is calculated as follows:

| Temperature/atmospheric pressure | 750 mmHg | 760 mmHg | 770 mmHg |
|---|---|---|---|
| 20° C. | 0.065 | −0.0004 | −0.087 |

| Temperature/atmospheric pressure | 750 mmHg | 760 mmHg | 770 mmHg |
|---|---|---|---|
| 23° C. | 0.065 | — | −0.087 |
| 26° C. | 0.067 | −0.002 | −0.084 |

(unit: ppm)

Thus given the above-mentioned glass combination, the stability of the optical path length difference ΔL is about ±0.09 ppm with respect to a temperature change of ±3° C. and an atmospheric pressure change of ±10 mmHg. The example above also provides for a practically unvarying wavelength reference.

Other glass combinations than those discussed above may also be used to ensure the wavelength reference of like stability.

As described, the third embodiment of the invention is simply constructed and yet provides good wavelength reference of high resistance to the changes in ambient conditions. That is, the embodiment is a simply constituted wavelength stabilizing light source apparatus with high resistance to environmental changes. The apparatus ensures stability in terms of wavelength reference for extended periods of time under varying ambient conditions.

As many apparently different embodiments of this invention may be made without departing from the spirit and scope thereof, it is to be understood that the invention is not limited to the specific embodiments thereof except as defined in the appended claims.

What is claimed is:

1. An optical path length difference forming device for forming a predetermined difference in length between a first optical path and a second optical path, said device comprising:

a first member located in said first optical path;

a second member located in said second optical path;

wherein the following mathematical expression is satisfied so as to keep constant the difference in length between said first optical path and said second optical path despite changes in temperature:

$$\{\Delta L2(n2+\Delta n2) - \Delta L1(n1+\Delta n1)\} + (\Delta n2 L2 - \Delta n1 L1) = (n+\Delta n) \times (h1 + \Delta L2 - \Delta L1) - n \times h1$$

where,

L1 is the length of said first member,

ΔL1 is the amount of change, in length, of said first member upon a temperature change, L2 is the length of said second member, ΔL2 is the amount of change in length of said second member upon said temperature change, n1 is the refractive index of said first member, Δn1 is the amount of change in refractive index of said first member upon said temperature change, n2 is the refractive index of said second member, Δn2 is the amount of change in refractive index of said second member upon said temperature change, n is the refractive index of the medium occupying the difference in length between said first member and said second member, Δn is the amount of change in refractive index of the medium occupying the difference in length between said first member and said second member upon said temperature change, and h1 is the difference in length between said member and said second member at a reference temperature;

wherein said refractive index n of said first member differs from said refractive index n2 of said second member and said predetermined difference in length between said first optical path and said second optical path is greater than zero.

2. An optical path length difference forming device according to claim 1, wherein said first member and said second member are substantially the same length.

3. An optical path length difference forming device according to claim 1, wherein said first member and said second member are formed from materials having respective expansion coefficients which are substantially the same.

* * * * *